United States Patent
Wu et al.

(10) Patent No.: US 9,543,330 B1
(45) Date of Patent: Jan. 10, 2017

(54) METHOD OF MANUFACTURING A THIN FILM TRANSISTOR AND A PIXEL STRUCTURE

(71) Applicant: Chunghwa Picture Tubes, LTD., Taoyuan (TW)

(72) Inventors: Der-Chun Wu, Taipei (TW); Shin-Chuan Chiang, Taipei (TW); Yu-Hsien Chen, Kaohsiung (TW); Po-Lung Chen, Taoyuan (TW); Yi-Hsien Lin, Taoyuan (TW); Cheng-Jung Yang, Hualien County (TW); Kuo-Hsing Tseng, New Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 14/809,021

(22) Filed: Jul. 24, 2015

(51) Int. Cl.
*H01L 21/00* (2006.01)
*H01L 27/12* (2006.01)
*H01L 29/786* (2006.01)

(52) U.S. Cl.
CPC ....... *H01L 27/1225* (2013.01); *H01L 27/1288* (2013.01); *H01L 29/7869* (2013.01)

(58) Field of Classification Search
CPC ............. H01L 27/1225; H01L 27/1288; H01L 29/7869
See application file for complete search history.

(56) References Cited

U.S. PATENT DOCUMENTS 8,586,406 B1 * 11/2013 Wu ................... H01L 29/66969
438/104
2011/0003418 A1 * 1/2011 Sakata .............. H01L 21/02554
438/34

FOREIGN PATENT DOCUMENTS

TW           I387109        2/2013
TW           I471948        2/2015

* cited by examiner

*Primary Examiner* — Shaun Campbell
(74) *Attorney, Agent, or Firm* — J.C. Patents

(57) ABSTRACT

A method manufacturing a thin film transistor is provided. A gate, a first insulation layer covering the gate, a semiconductor layer over the gate, and a first photoresist pattern are sequentially formed on a substrate. The semiconductor layer is patterned into a channel layer by using the first photoresist pattern as a mask and the first photoresist pattern is subsequently shrunken to remain a portion of the first photoresist pattern on the channel layer. A conductive material layer covering the remained portion of the first photoresist pattern, the channel layer and the first insulation layer is patterned by using a second photoresist pattern as a mask to form a source and a drain separated by a gap region exposing the remained portion. The second photoresist pattern and the remained portion are removed by performing a stripping process to expose the channel layer between the source and the drain.

18 Claims, 5 Drawing Sheets

METHOD OF MANUFACTURING A THIN FILM TRANSISTOR AND A PIXEL STRUCTURE

BACKGROUND OF THE INVENTION

1. Field of the Invention

The present invention generally relates to a method of manufacturing a thin film transistor and a pixel structure, in particular, to a method of manufacturing a thin film transistor having oxide channel layer and a pixel structure has the thin film transistor.

2. Description of Related Art

Generally speaking, a pixel structure in the display panel usually adopts a thin film transistor as a switch and elements (e.g., a gate, a source, a drain, and a channel layer) that form the thin film transistor are manufactured with a plurality of thin layers, respectively. Specifically, the source and the drain are usually manufactured in the same thin layer, whereas the channel layer is manufactured with another thin layer. In addition, the manufacturing of the source and the drain can be performed before or after the manufacturing of the channel layer.

Recently, an oxide semiconductor material such as IGZO (Indium Gallium Zinc Oxide) is used for manufacturing the channel layer in the thin film transistor because of the high field-effect mobility. However, the manufacturing of the channel layer by using the oxide semiconductor material, i.e., the oxide channel layer, requires overcoming certain problems. For example, when the source and the drain are formed before the channel layer, the processing gas (e.g., oxygen) for forming the oxide channel layer may oxidize the surfaces of the source and the drain. Thereby, the oxidized surfaces of the source and the drain may result in higher contact impedance between the oxide channel layer and the source/drain and reduce the device reliability of the oxide semiconductor thin film transistor.

Alternately, when the oxide channel layer is formed before the source and the drain, the step of patterning a conductive layer into the source and the drain by using an etching process may damage the oxide channel layer, thus reducing the device reliability of the oxide semiconductor thin film transistor. Therefore, the oxide semiconductor thin film transistor though can have desirable field-effect mobility, the difficulty of manufacturing the oxide semiconductor thin film transistor need be overcome.

SUMMARY OF THE INVENTION

Accordingly, the present invention is directed to a method of manufacturing a thin film transistor with desirable device characteristic.

Accordingly, the present invention is directed to a method of manufacturing a pixel structure having a thin film transistor with desirable device characteristic.

According to an embodiment of the present invention, a method of manufacturing a thin film transistor is provided. A gate, a first insulation layer, a semiconductor layer, and a first photoresist pattern are sequentially formed on a substrate, wherein the first insulation layer and the semiconductor layer cover the gate, and the first photoresist pattern is disposed on the semiconductor layer and located over the gate. The semiconductor layer is patterned into a channel layer by using the first photoresist pattern as a mask and the first photoresist pattern is subsequently shrunken to remain a portion of the first photoresist pattern on the channel layer. A conductive material layer is formed on the substrate to cover the remained portion of the first photoresist pattern, the channel layer and the first insulation layer. The conductive material layer is patterned by using a second photoresist pattern as a mask to form a source and a drain separated by a gap region exposing the remained portion of the first photoresist pattern. The second photoresist pattern and the remained portion of the first photoresist pattern are removed by using a same removing process to expose the channel layer between the source and the drain.

According to an embodiment of the present invention, a method of manufacturing a pixel structure is provided. A gate, a first insulation layer, a semiconductor layer, and a first photoresist pattern are sequentially formed on a substrate, wherein the first insulation layer and the semiconductor layer covers the gate and the first photo resist pattern is disposed on the semiconductor layer and located over the gate. The semiconductor layer is patterned into a channel layer by using the first photoresist pattern as a mask and the first photoresist pattern is subsequently shrunken to remain a portion of the first photoresist pattern on the channel layer. A conductive material layer is formed on the substrate to cover the remained portion of the first photoresist pattern, the channel layer and the first insulation layer. The conductive material layer is patterned by using a second photoresist pattern as a mask to form a source and a drain separated by a gap region exposing the remained portion of the first photoresist pattern. The second photoresist pattern and the remained portion of the first photoresist pattern are removed by using a same removing process to expose the channel layer between the source and the drain. A pixel electrode is formed and the pixel electrode is electrically connected to the drain.

According to an embodiment of the present invention, the remained portion of the first photoresist pattern is completely located within the gap region.

According to an embodiment of the present invention, the channel layer is completely covered by the conductive material layer and the remained portion of the first photoresist pattern until the source and the drain are formed.

According to an embodiment of the present invention, the first photoresist pattern has a thick portion and a thin portion connected to the thick portion, and the first photoresist pattern is shrunken by removing the thin portion and thinning the thick portion so as to expose a portion of the channel layer previously covered by the thin portion. In addition, the conductive material layer can be formed to contacting the exposed portion of the channel layer.

According to an embodiment of the present invention, an ashing process is performed to shrink the first photoresist pattern.

According to an embodiment of the present invention, a material of the first photoresist pattern is identical to a material of the second photoresist pattern.

According to an embodiment of the present invention, a second insulation layer covering the source, the drain and the channel layer between the source and the drain is further formed. The second insulation layer is formed to have a contact hole exposing the drain, the pixel electrode is formed after the forming of the contact hole and the pixel electrode is disposed in the contact hole to be electrically connected to the drain.

To sum up, an embodiment according to the present invention provides a method for forming the source and the drain after the formation of the channel layer without exposing the channel layer. Therefore, the channel layer would not be damaged by the patterning process for forming the source and the drain to manufacture the thin film transistor with desirable device property. In addition, according to the method of an embodiment of the present embodiment, no etching stop structure is remained between the source and the drain in the thin film transistor and thus the channel region in the channel layer between the source and the drain can be reduced to a width as small as the manufacturing limitation of the patterning process for the source and the drain.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
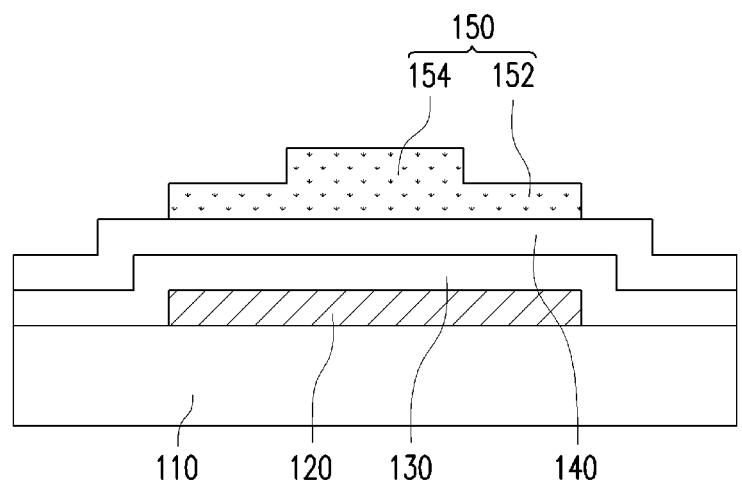
FIG. 1 to FIG. 9 schematically illustrate a method of manufacturing a pixel structure including a thin film transistor according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 to FIG. 9 schematically illustrate a method of manufacturing a pixel structure including a thin film transistor according to an embodiment of the present invention.

Referring to FIG. 1, in the present embodiment, a substrate 110 is provided, and a gate 120 is formed on the substrate 110. The gate 120 is made of a conductive material, such as metal, conductive oxide, conductive organic material, or the like and the gate 120 can be formed by a multilayer stack while each layer therein is a conductive layer. In one embodiment, a photolithography and etching process is performed to pattern a conductive material layer (not shown) previously formed on the substrate 110 to manufacture the gate 120. In an alternative embodiment, the gate 120 can be made by printing a conductive material in a predetermined area on the substrate 110.

A first insulation layer 130 is formed after the formation of the gate 120 and the first insulation layer 130 covers the gate 120 and the substrate 110 so that the gate 120 is sandwiched between the substrate 110 and the first insulation layer 130. In the present embodiment, the material of the first insulation layer 130 can include, but not limited to, silicon oxide, silicon nitride, silicon oxy-nitride, insulation polymer material, insulation organic material or the like. In addition, the first insulation layer 130 can include multiple sub-layers stacking in sequence while each sub-layer is an insulation layer.

A semiconductor layer 140 is then disposed on the first insulation layer 130 so that the first insulation layer 130 can isolate the gate 120 from the semiconductor layer 140 for preventing the short between the gate 110 and the element subsequently formed from the semiconductor layer 140. The semiconductor layer 140 is made of oxide semiconductor material such as indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO). The step of forming the semiconductor layer 140 includes performing a deposition process, e.g., the chemical vapor deposition process or the physical vapor deposition process. Particularly, for forming the oxide semiconductor material, the processing gas of the deposition process includes oxygen gas.

As shown in FIG. 1, a first photoresist pattern 150 is further formed on the semiconductor layer 140. The photoresist pattern 150 is made of a photosensitive material such as a photosensitive resin and patterned by using a half-tone or grey-tone photo-mask. Specifically, the first photoresist pattern 150 is located above the gate 120 and the photoresist pattern 150 includes at least one thin portion 152 and a thick portion 154. In the present embodiment, the two opposite sides of the thick portion 154 are respectively connected with one thin portion 152 so that the thick portion 154 is substantially the centre portion of the photoresist pattern 150. It can be seen from FIG. 1 that the gate 120, the first insulation layer 130, the semiconductor layer 140 and the first photoresist pattern 150 are sequentially formed on the substrate 110.

Figure 2:
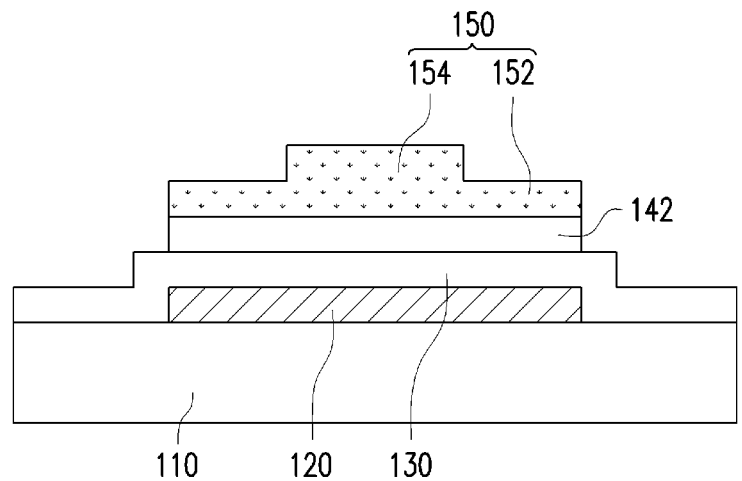

After forming the structure shown in FIG. 1, the semiconductor layer 140 is patterned by using the first photoresist pattern 150 as a mask so as to form a channel layer 142 depicted in FIG. 2. Referring to FIG. 2, the channel layer 142 is formed by the portion of the semiconductor layer 140 covered by the first photoresist pattern 150 and thus the channel layer 142 is located above the gate 120. In addition, after forming the channel layer 142, the first insulation layer 130 is partially exposed.

Figure 3:
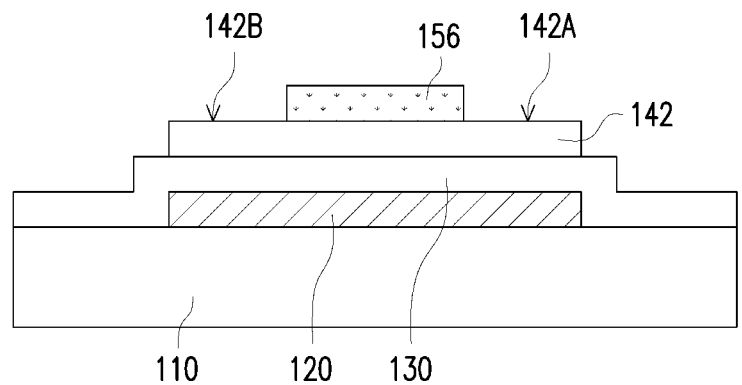

Subsequently, the first photoresist pattern 150 is shrunken to remain a remained portion 156 on the channel layer 142 as shown in FIG. 3. Referring to FIG. 2 and FIG. 3, during the step of shrinking the first photoresist pattern 150, the thin portions 152 are removed and simultaneously the thick portion 154 is partially thinned so that the remained portion 156 can be considered as a thinned thick portion 154. Specifically, the step of shrinking the first photoresist pattern 150 can include performing an ashing process or other process capable of completely removing the thin portion 152 without completely removing the thick portion 154. It can be seen from FIG. 3 that the portion 142A and the portion 142B of the channel layer 142 previously covered by the thin portion 152 are exposed after the shrinking.

Figure 4:
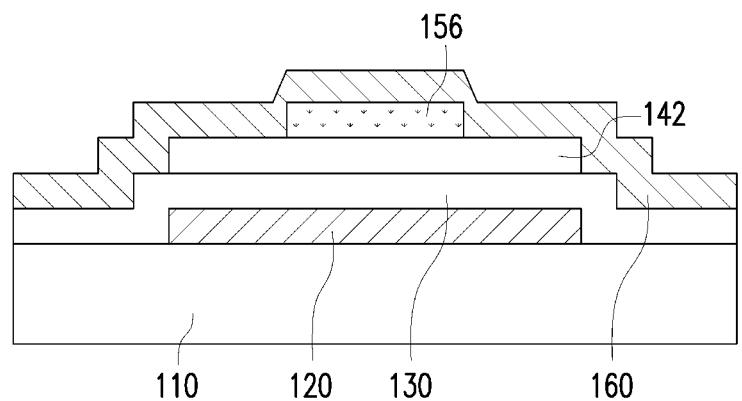
Figure 5:
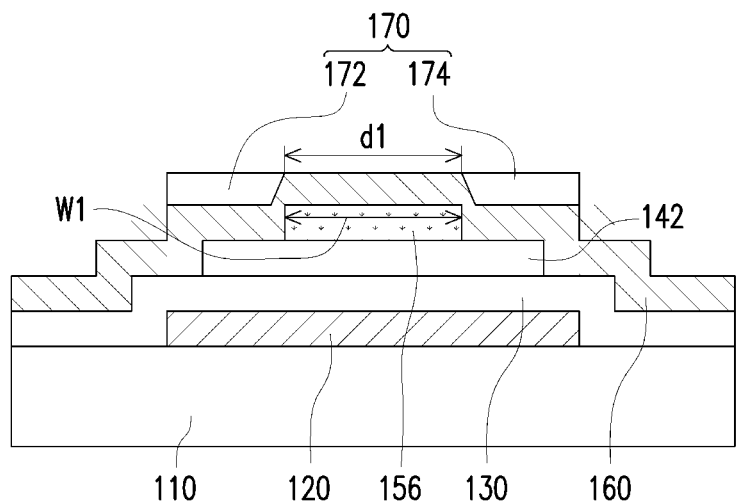

Next, in the step depicted in FIG. 4, a conductive material layer 160 is formed on the substrate 110. In the present embodiment, the conductive material layer 160 can be formed by performing a deposition process, such as a CVD (chemical vapour deposition) or a PVD (physical vapour deposition). A material of the conductive material layer 160 can include metal or other conductive material with desirable conductivity for transmitting electric signal. In addition, the conductive material layer 160 covers the remained portion 156, the channel layer 142 and the first insulation layer 130, and the conductive material layer 160 is in contact with the portions 142A and 142B of the channel layer 142 that is exposed by the remained portion 156.

In the present embodiment, the conductive material layer 160 is predetermined to be patterned for forming a specific element of a thin film transistor by lithography-etching process. Therefore, referring to FIG. 5, a second photoresist pattern 170 is subsequently formed on the conductive material layer 160.

Specifically, the second photoresist pattern 170 includes a first sub-pattern 172 and a second sub-pattern 174, wherein the first sub-pattern 172 and the second sub-pattern 174 are located at two opposite sides of the remained portion 156. The first sub-pattern 172 and the second sub-pattern 174 can be separated by a distance dl. In an embodiment, the distance dl can be substantially equal to 3 micron or smaller. In an alternative embodiment, the distance dl can be reduced to a value as small as the processing limitation of the photolithography. In addition, the distance dl can be substantially identical to the width W1 of the remained portion 156.

Figure 6:
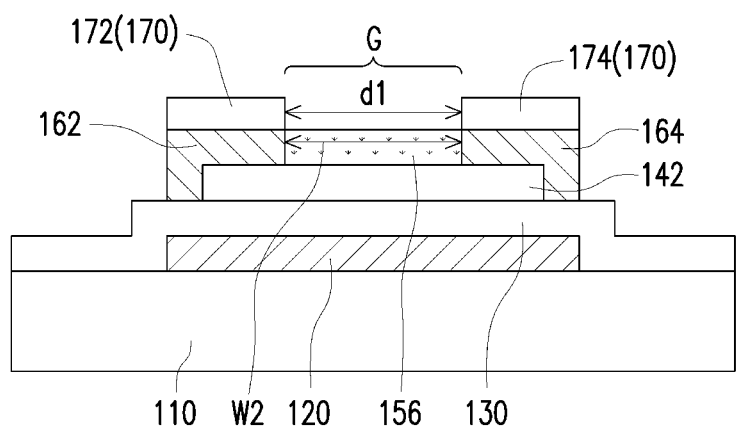

Subsequently, an etching process is performed by using the second photoresist pattern 170 as a mask to pattern the conductive material layer 160. After performing the etching process, the portions of the conductive material layer 160 covered by the first sub-pattern 172 and the second sub-pattern 174 are remained to form the source 162 and the drain 164 as shown in FIG. 6. Referring to FIG. 6, a portion of the conductive material layer 160 covering on the remained portion 156 is removed during the etching process. Accordingly, the source 162 and the drain 164 are separated from each other by a gap region G and the gap region G has a width W2 capable of exposing the remained portion 156 without exposing the channel layer 142. For example, the width W2 can be identical to the distance dl between the first sub-pattern 172 and the second sub-pattern 174. In the present embodiment, the channel layer 142 is still completely covered by the remained portion 156 and the metal material layer 160 until the predetermined shapes of the source 162 and the drain 164 are formed. Therefore, the channel layer 142 would not be in contact with the etchant for patterning the conductive material layer 160, which prevents the damage of the channel layer 142.

Thereafter, the second photoresist pattern 170 on the substrate 110 is removed. In the present embodiment, the remained portion 156 of the first photoresist pattern 150 is exposed after forming the source 162 and the drain 164. Accordingly, the step of removing the second photoresist pattern 170 can simultaneously remove the remained portion 156. Particularly, in the present embodiment, the first photoresist pattern 150 and the second photoresist pattern 170 can be made of the same material, and therefore, the first photoresist pattern 150 and the second photoresist pattern 170 can be removed by using the same removing agent in the same removing process such as a stripping process. After removing the first photoresist pattern 150 and the second photoresist pattern 170, the channel layer 142 within the gap region G is exposed. Herein, the thin film transistor TFT can be finished as shown in FIG. 7.

Figure 7:
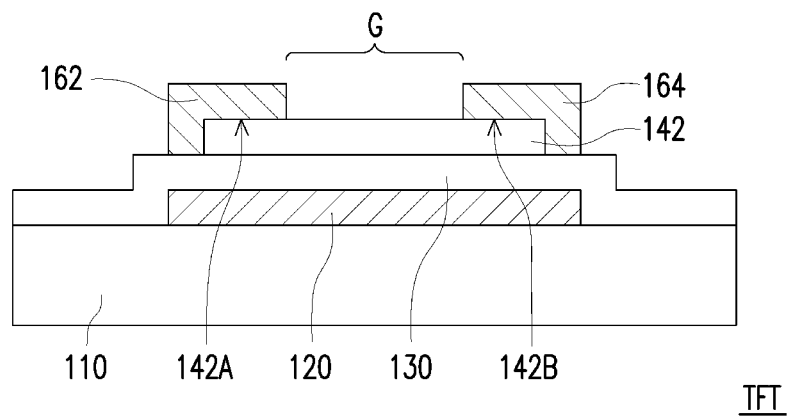

Referring FIG. 7, the thin film transistor TFT includes the gate 120 disposed on the substrate 110, the channel layer 142 located above the gate 120, the source 162 on the channel layer 142 and the drain 164 on the channel layer 142, while the first insulation layer 130 covers the gate 120 and the substrate 110 and isolates the gate 120 from the channel layer 142. In the present embodiment, the region between the portion 142A contacting the source 162 and the portion 142B contacting the drain 164 is served as the channel region of the channel layer 142, the channel region has a width substantially the same as the gap region G. Accordingly, the width of the channel region of the channel layer 142 can be reduced to a value as small as the processing limitation, which helps to reduce the size of the thin film transistor TFT.

Figure 8:
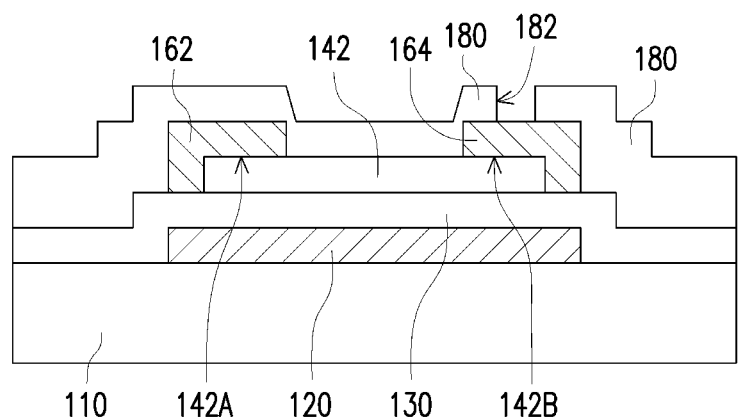

Next, referring to FIG. 8 a second insulation layer 180 can be formed on the substrate 110, and the second insulation layer 180 covers the source 162, the drain 164 and the channel layer 142 between the source 162 and the drain 164. In the present embodiment, the material of the second insulation layer 180 can be the same as the material of the first insulation layer 130, but this should not be construed as a limitation for the present invention. Specifically, the second insulation layer 180 can be formed to have a contact hole 182 exposing a portion of the drain 164. In addition, referring to FIG. 9, a pixel electrode 190 is formed on the second insulation layer 180 and the pixel electrode 190 is disposed in the contact hole 182 to be electrically connected to the drain 164. Herein, a pixel structure 100 shown in FIG. 9 is completed.

Figure 9:
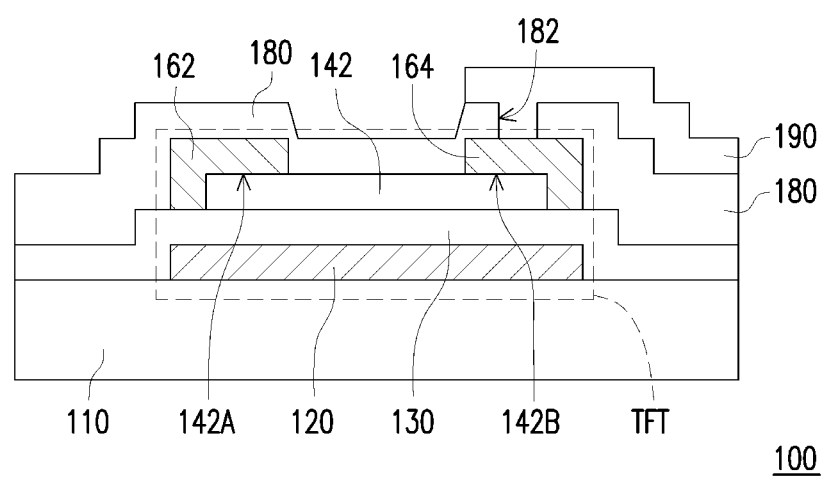

Referring to FIG. 9, the pixel structure 100 includes the thin film transistor TFT and the pixel electrode 190 electrically connected to the thin film transistor TFT. According to the manufacturing method of the present embodiment, the channel layer 142 can be made of the oxide semiconductor material and the channel layer 142 can be prevented from being damaged during forming the source 162 and the drain 164. Therefore, the thin film transistor TFT can provide desirable property for serving as a switch in the pixel structure 100. In addition, the channel region of the thin film transistor TFT can be reduced to 3 micron, or smaller, which facilitates to reduce the size of the thin film transistor TFT.

In light of the foregoing, the channel layer of the thin film transistor according to an embodiment of the present invention is made of oxide semiconductor material so as to have high field-effect mobility. In addition, according to the embodiment of the present invention, the channel layer is completely covered during forming the source and the drain, and thus the channel layer would not be damaged during the etching process for forming the source and the drain. Accordingly, the thin film transistor manufactured by using the method according to the embodiment of the present invention can have desirable device property so as to enhance the quality of the pixel structure having the thin film transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method of manufacturing a thin film transistor comprising:
    sequentially forming a gate, an insulation layer, a semiconductor layer, and a first photoresist pattern on a substrate, the insulation layer and the semiconductor layer covering the gate and the first photoresist pattern being disposed on the semiconductor layer and located over the gate;
    patterning the semiconductor layer into a channel layer by using the first photoresist pattern as a mask and subsequently shrinking the first photoresist pattern to remain a remained portion of the first photoresist pattern on the channel layer;
    forming a conductive material layer on the substrate to cover the remained portion of the first photoresist pattern, the channel layer and the insulation layer;
    patterning the conductive material layer by using a second photoresist pattern as a mask to form a source and a drain separated by a gap region exposing the remained portion of the first photoresist pattern; and
    removing completely the second photoresist pattern and the remained portion of the first photoresist pattern at a same time by performing a stripping process to simultaneously expose the drain, the source, and the channel layer between the source and the drain after the source and the drain is formed, wherein the first photoresist pattern and the second photoresist pattern are two different films disposed on two different layers.

2. The method of manufacturing a thin film transistor according to claim 1, wherein the remained portion of the first photoresist pattern is completely located within the gap region.

3. The method of manufacturing a thin film transistor according to claim 1, wherein the channel layer is completely covered by the conductive material layer and the remained portion of the first photoresist pattern until the source and the drain are formed.

4. The method of manufacturing a thin film transistor according to claim 1, wherein the first photoresist pattern has a thick portion and a thin portion connected to the thick portion, and the first photoresist pattern is shrunken by removing the thin portion and thinning the thick portion so as to expose a portion of the channel layer previously covered by the thin portion.

5. The method of manufacturing a thin film transistor according to claim 4, wherein the conductive material layer is formed to contact the exposed portion of the channel layer.

6. The method of manufacturing a thin film transistor according to claim 1, wherein the first photoresist pattern is shrunken by performing an ashing process.

7. The method of manufacturing a thin film transistor according to claim 1, wherein a material of the first photoresist pattern is identical to a material of the second photoresist pattern.

8. The method of manufacturing a thin film transistor according to claim 1, wherein a material of the semiconductor layer comprises an oxide semiconductor material.

9. A method of manufacturing a pixel structure comprising:
sequentially forming a gate, a first insulation layer, a semiconductor layer, and a first photoresist pattern on a substrate, the first insulation layer and the semiconductor layer covering the gate and the first photo resist pattern being disposed on the semiconductor layer and located over the gate;
patterning the semiconductor layer into a channel layer by using the first photoresist pattern as a mask and subsequently shrinking the first photoresist pattern to remain a remained portion of the first photoresist pattern on the channel layer;
forming a conductive material layer on the substrate to cover the remained portion of the first photoresist pattern, the channel layer and the first insulation layer;
patterning the conductive material layer by using a second photoresist pattern as a mask to form a source and a drain separated by a gap region exposing the remained portion of the first photoresist pattern;
removing completely the second photoresist pattern and the remained portion of the first photoresist pattern at a same time by performing a stripping process to simultaneously expose the drain, the source, and the channel layer between the source and the drain after the source and the drain is formed, wherein the first photoresist pattern and the second photoresist pattern are two different films disposed on two different layers; and
forming a pixel electrode electrically connected to the drain.

10. The method of manufacturing a pixel structure according to claim 9, wherein the remained portion of the first photoresist pattern is completely located within the gap region.

11. The method of manufacturing a pixel structure according to claim 9, wherein the channel layer is completely covered by the conductive material layer and the remained portion of the first photoresist pattern until the source and the drain are formed.

12. The method of manufacturing a pixel structure according to claim 9, wherein the first photoresist pattern has a thick portion and a thin portion connected to the thick portion, and the first photoresist pattern is shrunken by removing the thin portion and thinning the thick portion so as to expose a portion of the channel layer previously covered by the thin portion.

13. The method of manufacturing a pixel structure according to claim 12, wherein the conductive material layer is formed to contact the exposed portion of the channel layer.

14. The method of manufacturing a pixel structure according to claim 9, wherein the first photoresist pattern is shrunken by performing an ashing process.

15. The method of manufacturing a pixel structure according to claim 9, wherein a material of the first photoresist pattern is identical to a material of the second photoresist pattern.

16. The method of manufacturing a pixel structure according to claim 9, wherein a material of the semiconductor layer comprises an oxide semiconductor material.

17. The method of manufacturing a pixel structure according to claim 9, further comprising forming a second insulation layer covering the source, the drain and the channel layer between the source and the drain.

18. The method of manufacturing a pixel structure according to claim 17, wherein the second insulation layer is formed to have a contact hole exposing the drain, the pixel electrode is formed after the forming of the contact hole and the pixel electrode is disposed in the contact hole to be electrically connected to the drain.

* * * * *